United States Patent [19]
Wolfshagen et al.

[11] 4,106,106
[45] Aug. 8, 1978

[54] UNIFORM ROTATING FIELD NETWORK STRUCTURE TO EFFICIENTLY PACKAGE A MAGNETIC BUBBLE DOMAIN MEMORY

[75] Inventors: Ronald G. Wolfshagen, Newport Beach; John E. Ypma, Anaheim; Glen W. Murray, Irvine; Thomas T. Chen, Yorba Linda, all of Calif.

[73] Assignee: Rockwell International Corporation, El Segundo, Calif.

[21] Appl. No.: 667,338

[22] Filed: Mar. 16, 1976

Related U.S. Application Data

[63] Continuation-in-part of Ser. No. 548,943, Feb. 11, 1975, abandoned.

[51] Int. Cl.² .............................................. G11C 19/08
[52] U.S. Cl. ....................................................... 365/2
[58] Field of Search .................................. 340/174 TF

[56] References Cited

U.S. PATENT DOCUMENTS 3,971,126  7/1976  Buhrer .......................... 340/174 TF

OTHER PUBLICATIONS

IEEE Transactions on Magnetics—Mag. 10, No. 3, Sep. 1974, pp. 753-756.
IEEE Transactions on Magnetics—Mag. 9, No. 3, Sep. 1973, pp. 429-433.

*Primary Examiner*—James W. Moffit
*Attorney, Agent, or Firm*—H. Fredrick Hamann; G. Donald Weber, Jr.; Morland C. Fischer

[57] ABSTRACT

A unique and compact open coil rotating magnetic field network structure to efficiently package an array of bubble domain devices is disclosed. The field network has a configuration which effectively enables selected bubble domain devices from the array to be driven in a vertical magnetic field and in an independent and uniform horizontal rotating magnetic field. The field network is suitably adapted to minimize undesirable inductance effects, improve capabilities of heat dissipation, and facilitate repair or replacement of a bubble device.

16 Claims, 10 Drawing Figures

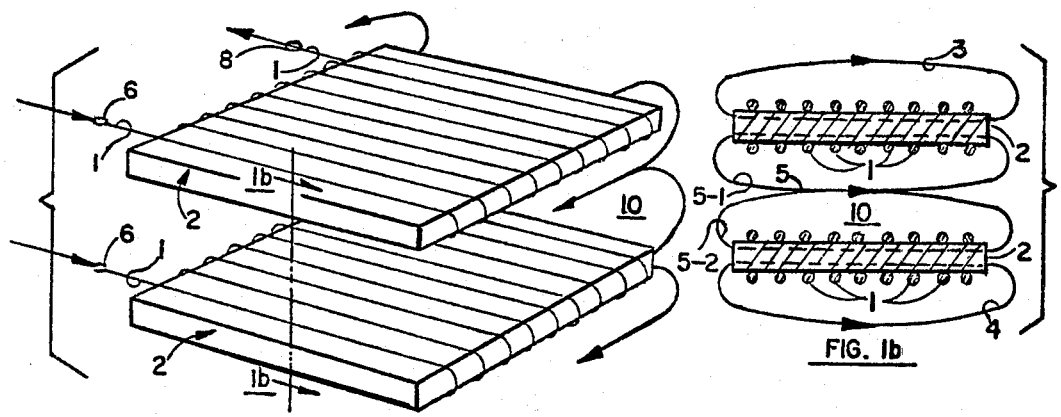
FIG. 1a
FIG. 1b
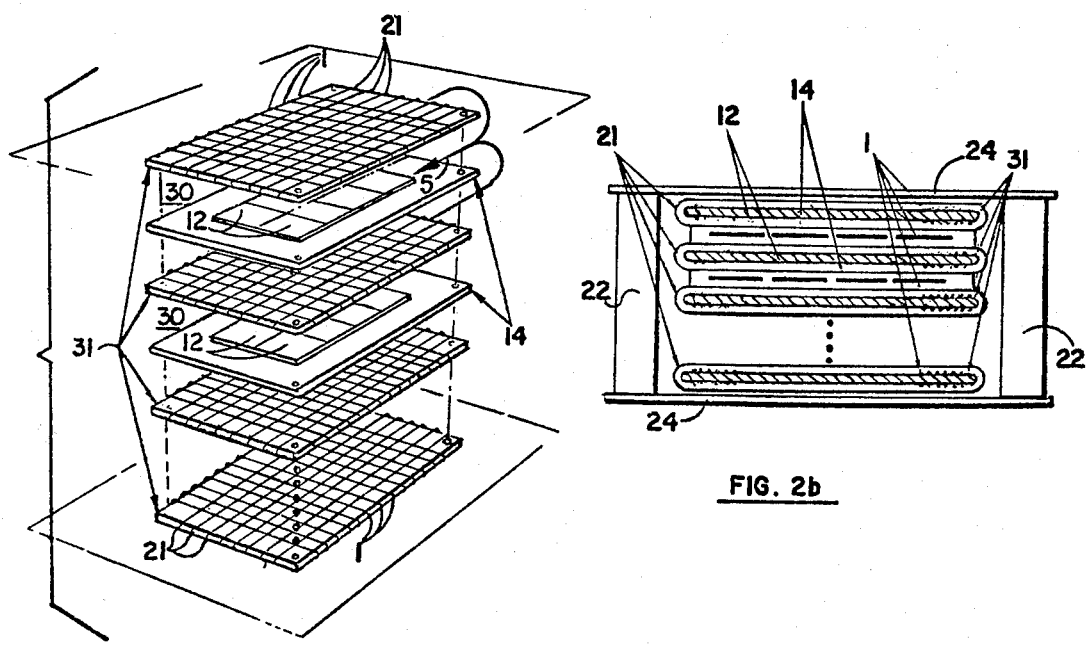
FIG 2a
FIG. 2b

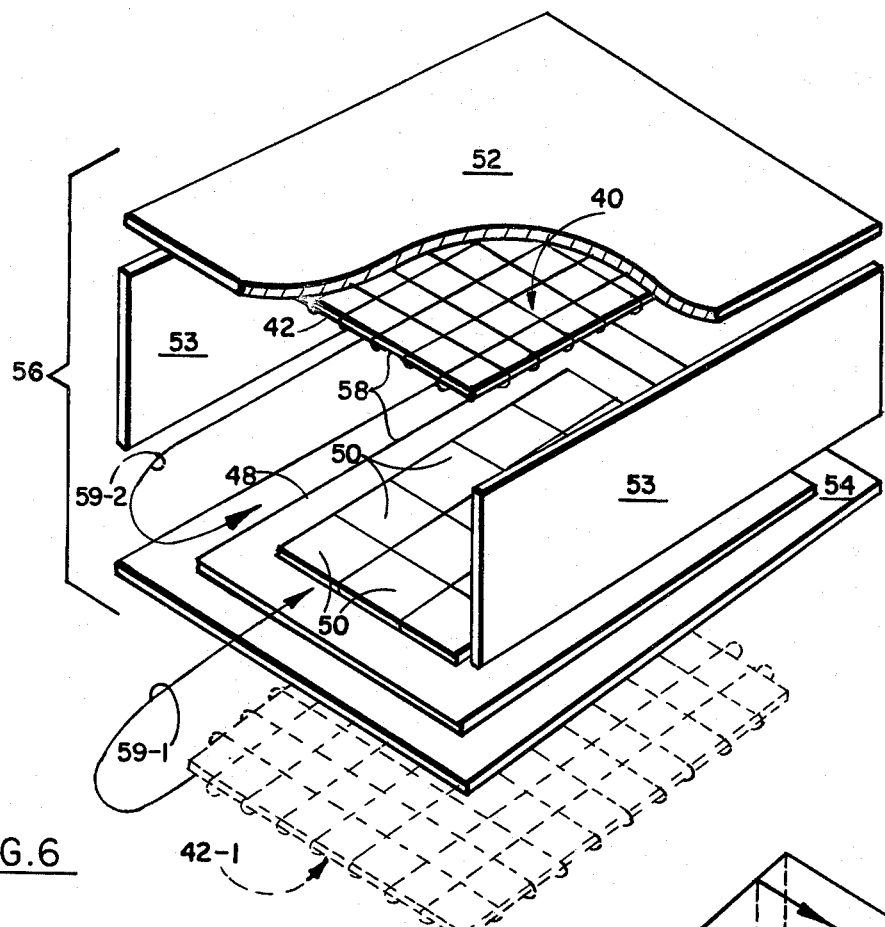
FIG. 6
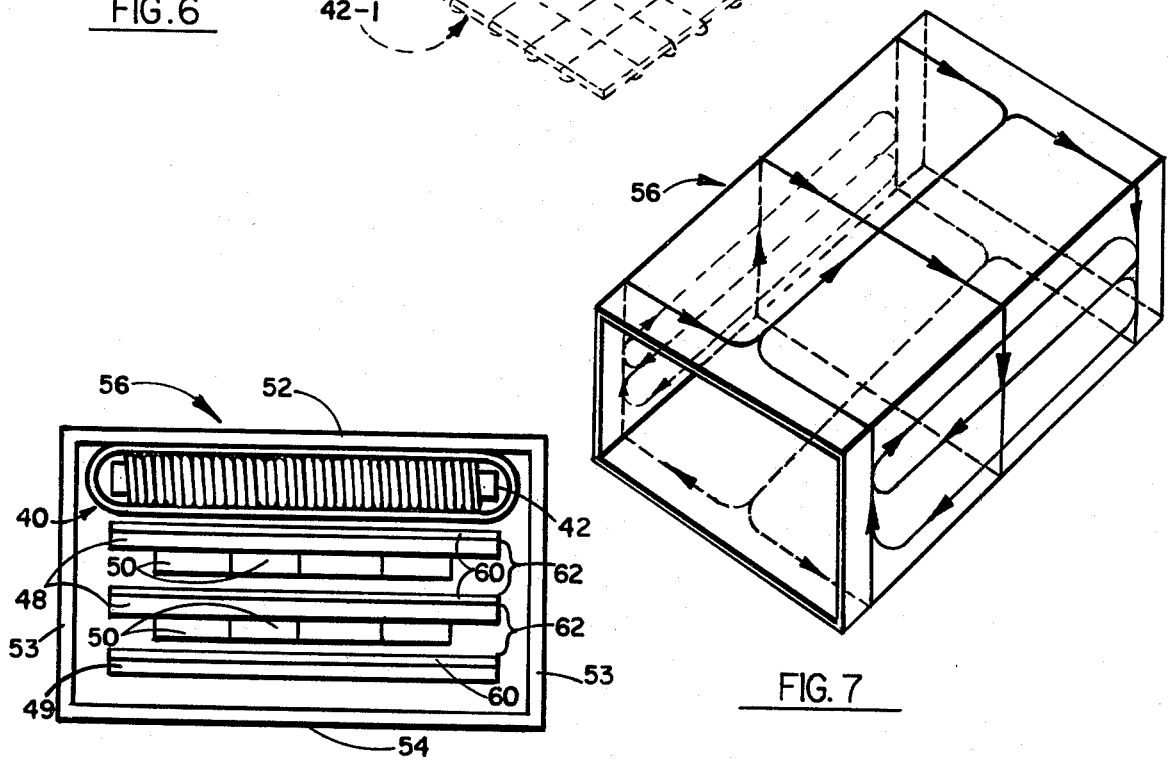
FIG. 7
FIG. 8

UNIFORM ROTATING FIELD NETWORK STRUCTURE TO EFFICIENTLY PACKAGE A MAGNETIC BUBBLE DOMAIN MEMORY

The invention described herein was made in the performance of work under NASA Contract No. NAS1-12435 and is subject to the provisions of section 305 of the National Aeronautics and Space Act of 1958 (72 Stat. 435; 42 U.S.C. 2457).

CROSS-REFERENCES TO RELATED PATENT APPLICATIONS

This application is a continuation-in-part of U.S. Ser. No. 548,943, filed Feb. 11, 1975, and now abanoned.

BACKGROUND OF THE INVENTION

1. Field of the Invention

This invention relates to a compact bias structure to efficiently package an array of bubble domain devices within a uniform rotating magnetic field.

2. Description of the Prior Art

Prior art packaging of bubble domain devices is limited by the means in which a required in-plane rotating magnetic field is generated. For example, a conventional wire wound coil configuration to generate a magnetic field requires that a bubble device be enclosed in a respective closely wound coil structure. This type of configuration employs separate packages. Consequently, a relatively large number of electrical components and interconnections therebetween are employed when an array (e.g., such as that comprising a magnetic bubble memory) of such bubble devices is to be utilized. Thus, the size and expense of fabricating a large array is undesirably increased. What is more, the confined structure of a bubble device and the closely wound coil prevents easy access thereto for repair or replacement. Moreover, the close proximity of a coil winding to a bubble device increases the adverse effects of inductance and associated heat generation.

One example of a known open coil structure is that which utilizes a flat Helmholtz type coil having a ferrite core inserted into the coil. For flux closure, a ferrite ring encircles the assembly. However, although the use of ferrite pole pieces can improve the magnetic field uniformity, they also introduce distortions as a result of the coupling of orthogonally disposed pole pieces. The sensitivity of this arrangement is also low. This is due to the large leakage path between pole pieces and to the large demagnetization factor of the individual pole pieces. The overall efficiency of this network can be improved by matrixing the coil windings so that the field from both ends of a respective pole piece can be utilized. This results in a large field network which requires that all of the coil windings in one plane be energized simultaneously and, thus, by a large driving power. Moreover, all of the devices and coils must be aligned in one plane which introduces packaging problems. What is more, ferrite poles will reduce the efficiency of a bias structure and also interfere with a rotating field in other device planes placed above or below.

Another example of a known open coil structure is that which utilizes a flat faced coil. Instead of using a closed winding, the return path of the conductor current is spread into a plane formed from a flat spiral coil. Two sides of this coil are straight with parallel wires. When two of the coils are placed face to face, the magnetic field in the area between the straight sections of the coil is identical to that inside a flat solenoid coil. By placing two sets of these spiral coils perpendicular with respect to each other, a rotating field can be achieved. However, the coil area cannot be fully used because of the circular part of the spiral winding and the center open space in each of the flat faced coils which is required to minimize the interference between opposite current paths. Thus, only a limited area of the face to face flat coils is usable, and each of the usable areas has a different rotating field phasing and direction. A pair of bubble memory chips with two different sense and rotation (i.e., clockwise and counterclockwise) must be used. Moreover, this arrangement does not permit stack packaging without additional decoupling provided by ferrite plates between the face to face coil planes.

SUMMARY OF THE INVENTION

A compact open coil field network to efficiently package a plurality of bubble domain devices (e.g., such as that typically found in a magnetic bubble memory) within a uniform rotating magnetic field is disclosed. The network includes a pair of parallel arranged ferromagnetic plates or cores which, in a preferred embodiment, are fabricated from a ferrite material. Two coils are orthogonally wound with respect to one another around each ferromagnetic plate. A bias structure includes a pair of magnetized end plates to produce a vertical magnetic field. Means are provided to drive the coil windings and establish a uniform horizontal rotating magnetic field.

At least one chip containing a magnetic bubble domain device is positioned on a substrate and in the region between a respective pair of parallel ferromagnetic plates. However, the field network may include any convenient combination of bubble domain chips stacked vertically and arranged horizontally between pairs of the parallel ferromagnetic plates. Hence, a single bubble module of reduced size is provided, wherein a plurality of bubble device chips may be selectively driven by independent and uniform rotating magnetic fields induced from respective parallel ferromagnetic plates.

In another embodiment of the invention, a uniform rotating magnetic field is generated and the number of wound plates or cores of an open coil field network (and consequently the corresponding overall inductance thereof) is reduced by including an enclosure comprising two or more parallel, electrically conducting and non-magnetic surfaces. At least one chip containing a bubble domain device is positioned on a substrate and in a uniform field confined to the region between the conducting surfaces. The conducting surfaces simulate a coil winding by virtue of the eddy currents therein, but eliminate the driving requirements of a winding and thereby converse space and reduce cost of the field network.

BRIEF DESCRIPTION OF THE DRAWINGS

FIGS. 1a and 1b show the open coil network of the instant invention to efficiently package a bubble domain device;

FIGS. 2a and 2b show a compact bias structure for packaging a memory array of bubble domain devices in a uniform rotating magnetic field;

FIGS. 4–8 show other embodiments of the instant invention including an open coil field network of reduced size and number of components to drive an array of magnetic bubble devices in a uniform, rotating magnetic field of increased efficiency.

DESCRIPTION OF THE PREFERRED EMBODIMENT

Figure 3:
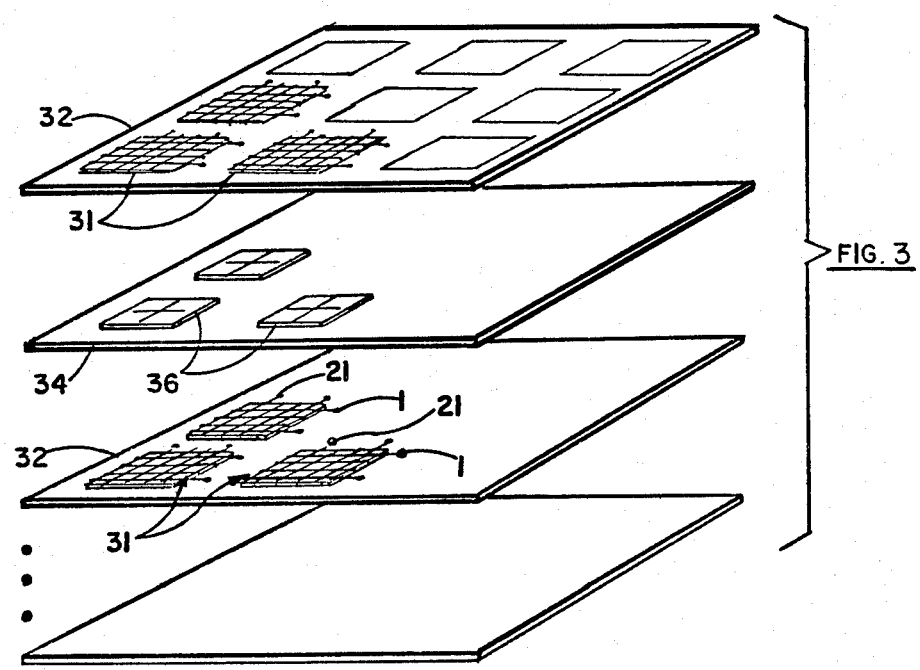
FIG. 3 shows a compact bubble memory module wherein a large number of bubble domain chips are driven in several independent, uniform rotating magnetic fields.

In accordance with the instant invention, a unique open coil network to efficiently package a bubble domain device is shown in FIGS. 1a and 1b. A coil winding 1 is wrapped around a respective core or plate 2. In a preferred embodiment, plate 2 is comprised of a ferromagnetic material which possesses a low reluctance and high permeability, such as that typically found in a ferrite material. On example of a suitable ferrite material which may comprise the ferromagnetic plate 2 is material No. H6H2 manufactured by a TDK, Inc. The coil winding 1 is connected to terminals 6 and 8 of a suitable driver (not shown), such as a high frequency (e.g., 200 KHz) power amplifier. Current flows through a coil winding 1, and an associated in-plane, horizontal magnetic field is induced with respect to plate 2. By disposing two ferromagnetic plates 2 and associated coil windings 1 in a parallel arrangement, as shown, the magnetic field induced in the region 10 between the plates 2 (as indicated by the direction of the arrows) is equivalent to that which would be generated inside a close wound coil. However, many of the restrictions occurring between a coil and a respective plate of a conventional close wound coil arrangement are eliminated.

The flux path 5, in the region 10 between plates 2 is the additive resultant of flux paths 5-1 and 5-2, as shown. The ferromagnetic plates 2 act as a short circuit for individual flux paths 3 and 4 and 5-1 and 5-2. However, a ferromagnetic plate 2 (e.g., comprised of a ferrite material to intensify the horizontal magnetic field bias in region 10) has an advantageous property of magnetic shielding. Hence, those magnetic fields (e.g., 3 and 4 induced above and below the parallel combination of plates 2) which would otherwise adversely act to oppose the direction of the resultant magnetic field 5 are shielded from region 10 between plates 2. Therefore, the magnetic field induced in the space above or below an individual plate 2 is equivalent to the field which would be induced from a single layer of conductors.

A bubble domain device chip (not shown) can be packaged in a compact network, either as an individual chip or as part of an array, outside the coil windings 1 and in the region of magnified flux density 10 between plates 2. By virtue of the instant open coil arrangement, the coil windings 1 are separated from a bubble device. Therefore, the coil size can be independently adjusted to an optimum value in terms of power dissipation and field uniformity. Also, the entire assembly is open and less confined than the structure of a close wound coil system. Thus, a cooling arrangement, e.g., such as forced air cooling, can be more easily utilized to achieve better thermal equilibrium than feasible with the close wound coil systems. Moreover, all of the bubble devices and the coil windings 1 and ferromagnetic plates 2 are separable and interchangeable. Thus, restraints on packaging can be minimized while parts may be freely substituted for repair or replacement.

An efficient configuration for arranging a memory array of bubble domain devices in a uniform rotating magnetic field in the open coil network of the instant invention is shown in FIGs. 2a and 2b. A plurality of magnetic bubble devices (i.e., a stable region of reversed magnetization in a thin film of magnetized material, such as, for example, an orthoferrite, garnet, or other suitable material) are disposed upon chips 12. The chips 12 are secured to respective device planes 14 which are comprised of a suitable non-conducting, non-magnetic material, such as ceramic or plexiglass. An in-plane, horizontal rotating magnetic field is induced by two coils 1 and 21 which are orthogonally wound around each ferromagnetic plate 31 and driven 90° out of phase with respect to each other. By virtue of the unique field network arrangement of wound parallel ferromagnetic plates 31, the vertical components of the in-plane, horizontal field cancel out one another and the bubble memory chips 12 are driven in region 30 having a uniform rotating magnetic field. However, unlike known prior art open coil arrangements, the horizontal field rotates in a single direction, thus alleviating the need for relatively complex bubble chip pairs or position detectors.

The instant field network, including the array of wound ferromagnetic plates 31 and the arrays of bubble memory chips 12 is contained in a compact bias structure, such as that best shown in FIG. 2b. The bias structure includes a pair of magnetized end plates 22 (e.g., bar magnets magnetized in the same direction to produce a vertical magnetic field and formed of a material such as barium ferrite or that known under the name of alnico) and top and bottom plates 24 which are formed of a soft magnetic (e.g., permalloy) material. The stacking of the ferromagnetic plates 31 in the bias structure according to the instant invention advantageously utilizes a single structure to package the bubble memory chips 12 and associated electronics (not shown). Thus, many of the interconnections that are required in conventional packaging configurations are eliminated. The instant bias structure also makes efficient use of the magnetic field induced on both sides of a ferromagnetic plate 31.

The open coil configuration of the instant invention can be efficiently utilized in a bubble memory module where it is desirable to drive a large number of chips in several independent, uniform rotating magnetic fields. Such a packaging module is shown in FIG. 3. A plurality of ferromagnetic plates 31 having associated orthogonal windings 1 and 21 to induce respective rotating fields, are disposed in a convenient array on a coil plane 32. A plurality of bubble memory device chips 36 are disposed in a convenient array on a separate device plane 34. Both the coil planes 32 and device planes 34 are fabricated from a suitable nonconducting, non-magnetic material, such as ceramic or plexiglass. The device planes 34 and associated bubble devices 36 are inserted between the parallel plates 31 of adjacent coil planes 32. Any convenient number of bubble memory chips 36, which are positioned between a respective pair of ferromagnetic plates 31, can be operated as an independent unit to be selectively driven in a corresponding independent rotating magnetic field. Moreover, by virtue of the memory module packaging of FIG. 3, the ferromagnetic plates 31 and the associated coil windings 1 and 21 may be reduced in size so as to minimize undesirable inductance effects which are known in conventional memory modules.

Figure 4:
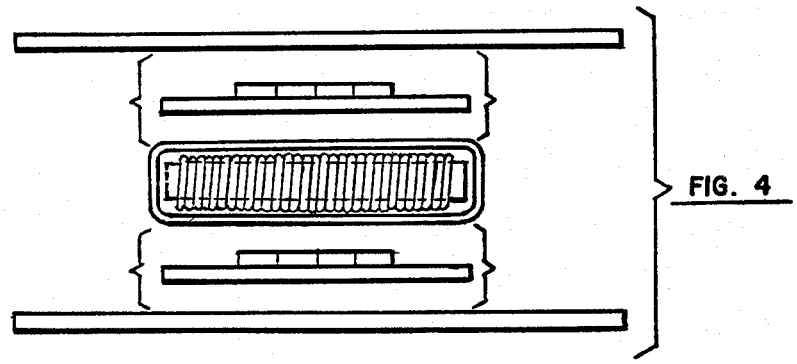
Figure 5:
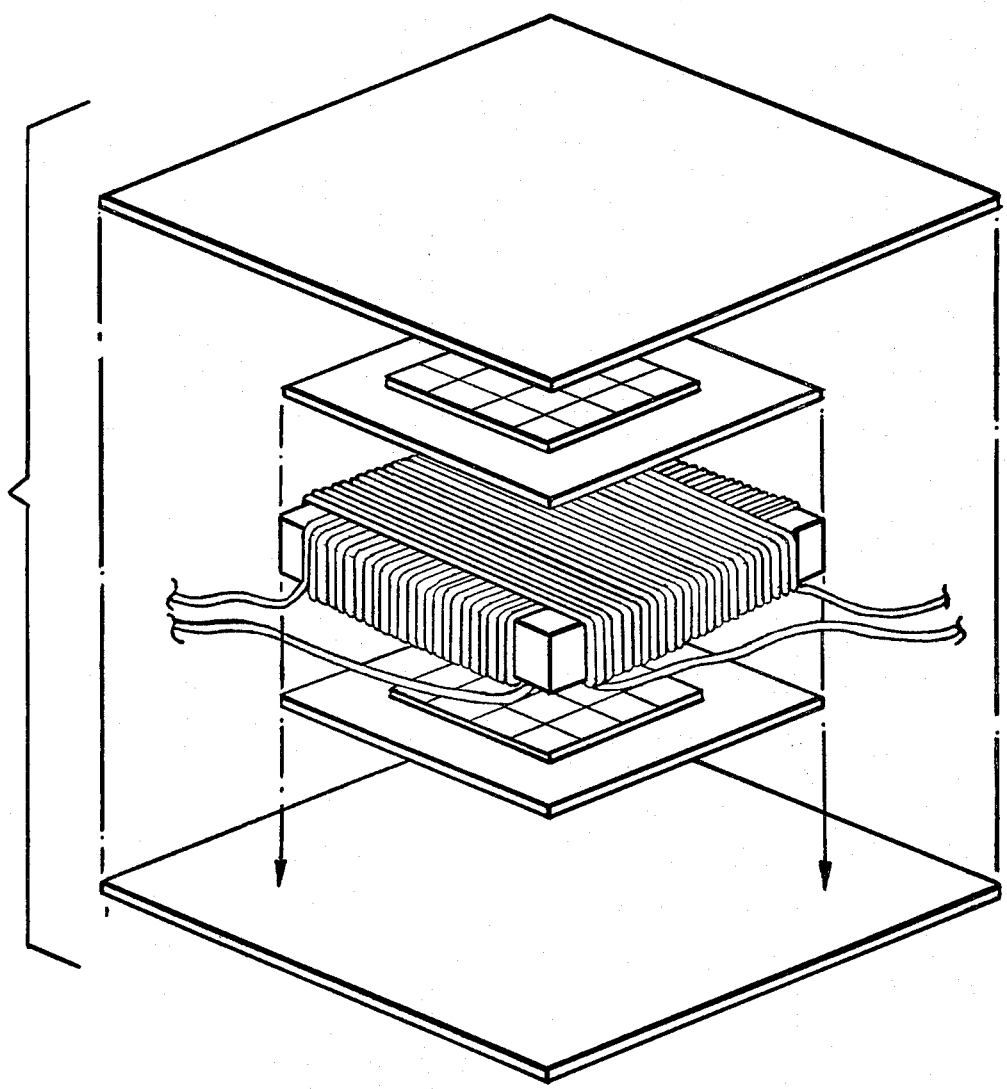

FIGS. 4 and 5 show another embodiment of the instant invention. An open coil field network 40 includes a plate or core 42 which may be fabricated from either a suitable non-magnetic (e.g., plastic) or magnetically soft (e.g., ferrite) material. Coil windings 44 and 46 are orthogonally wound around common core 42 and driven 90° out of phase with respect to each other by a suitable high frequency source (not shown) in order to generate a rotating magnetic field in the in-plane, horizontal direction. A convenient array of bubble device chips 50 are disposed on device planes 48. Device planes 48 are fabricated from a suitable non-conducting, non-magnetic material (such as a printed circuit board). A coil wound core 42 is positioned between a pair of device planes 48. Device planes 48 are aligned in a substantially parallel relationship with respect to one another and to core 42. Thus, the bubble domain devices 50 are positioned in the induced external, rotating magnetic field and outside the windings of coils 44 and 46.

In accordance with the instant invention, a parallel pair of non-magnetic and electrically conducting shields 52 and 54 (which may be comprised of aluminum, copper or the like) are disposed above and below a parallel pair of device planes 48, as shown. The upper and lower shields 52 and 54 confine the generally widespread and otherwise non-uniform external rotating magnetic field to the proximity of coils 44 and 46 and, thus, to bubble device chips 50. At operating frequencies (e.g., such as that less than 1 MHz) the time varying magnetic field generated by coil windings 44 and 46 produce eddy currents in the electrically conducting shields 52 and 54. The preferred frequency of operation is generally dependent upon electrical and mechanical properties (e.g., such as thickness) of shields 52 and 54. The eddy currents produced in shields 52 and 54 have the effect of simulating the existences of additional coil wound cores or, more particularly, mirror images of coil wound core 42. Thus, the resultant rotating magnetic field in the inplane, horizontal direction (as indicated by the direction of arrows 55) will be a uniform magnetic field. The opposing vertical components (not shown) of the induced magnetic fields act to cancel out one another.

As best illustrated in FIG. 5, side walls 53 are provided for shields 52 and 54. In one embodiment, the side walls 53 are formed from a non-magnetic, non-conducting material, such as air, a potting compound or plastic. Although only two device planes 48 containing bubble domain device 50 are shown, the instant configuration may include any convenient number thereof. Similarly, although only one coil wound common core 42 and associated pair of top and bottom shields 52 and 54 are shown, the invention is not to be regarded as limited thereto. Any convenient stacking of coil wound cores 42 and respective top and bottom shields 52 and 54 are contemplated. A suitable bias structure 65 may surround shields 52 and 54, sidewalls 53 and the open coil field network 40.

In another embodiment, and as illustrated in FIG. 6, sidewalls 53 are also comprised of a non-magnetic and electrically conducting material (e.g., aluminum, copper, or the like), as are shields 52 and 54. The shields 52 and 54 and sidewalls 53 may be arranged to form a substantially rectangular enclosure having the shape of either a tube or can. To permit access to a bubble device chip 50 and to allow electrical interconnection of several coil wound cores 42 (in parallel or series) without utilizing flex cables, the ends of the enclosure may be left open as desired.

FIG. 6 shows an exploded view of one preferred enclosure 56 having non-magnetic and electrically conducting surfaces 52, 53 and 54 which has the shape of an open-ended can. Eddy currents circulate around the improved enclosure 56 in a single, efficient and continuous current loop, as best indicated by the arrows in FIG. 7. The circulating eddy currents in each conducting surface 52, 53 and 54 magnetically simulate the mirror image of a respective coil wound core (only one of which, 42-1, is shown dotted in FIG. 6), which coil is reflected outside enclosure 56. Simulating a coil wound core outside the enclosure has the effect of maximizing the usable volume of enclosure 56 while reducing both reactive and resistive power losses. Enclosing a field network 40 and one or more bubble device chips 50 by the electrically conducting surfaces 52, 53 and 54 of enclosure 56 produces a highly uniform and planar rotating magnetic field in close proximity to the field network. The geometry of the present enclosure 56 minimizes inefficient field spreading and undesirable field network inductance by confining the uniform and planar rotating magnetic field to the region 58 between a coil wound core 42 and a conducting surface 54. By virtue of the improved enclosure 56, the magnetic field (represented by arrow 59-1) induced by the eddy currents in the shields and sidewalls of the improved enclosure and the widely spread magnetic field (represented by arrow 59-2) generated by a field network 40 sum vectorially in region 58. Opposing magnetic fields (not shown) outside enclosure 56 are vectorially cancelled with respect to one another.

One or more coil wound cores 42 are conveniently disposed within the volume defined by enclosure 56. By way of example, a single coil wound core 42 is mounted at the inner side of one conducting surface (52). As a result of the uniform and planar magnetic field region 58, substantially all the volume of enclosure 56 is available for placement of any suitable number of bubble device chips (either singly or on stacked device planes 48) without using complicated coil forms and heat transfer paths, as are otherwise required in conventional assemblies. Also by way of example, a single chip plane is mounted at the inner side of the conducting surface (54) opposite the conducting surface 52 at which is mounted the coil wound core 42. Thus, by disposing a coil wound core 42 and a plurality of bubble device chips 50 at opposing conducting surfaces (e.g., 52 and 54), the coil wound core and bubble device can be efficiently cooled with thermal conduction by means of a well known heat sink (not shown), or the like. Although only one device plane 48 containing bubble device chips 50 is shown, it is to be understood that the present enclosure 56 may include any suitable number of device planes and bubble devices positioned adjacent one or both sides of one or more coil wound cores 42.

Referring to FIG. 8, an end view of the improved enclosure 56 of FIGS. 6 and 7 is illustrated. When it is desirable to stack a plurality of bubble devices 50 on two or more device planes 48 adjacent the same side of a field network 40, the magnetic field becomes increasingly non-uniform as the spacing between a coil wound core 42 and the opposite conducting surface 54 is increased. However, it has been found that the induced magnetic field can be made substantially uniform and planar by including sheets 60 of non-magnetic, electrically conducting shielding material (e.g., aluminum, copper or the like) within the improved enclosure 56. Each sheet 60 is attached to the side of a respective device plane 48 facing the field network 40 so as to be aligned in a parallel plane with the plane of the bubble device chips 50. The shield 60 positioned farthest away from coil wound core 42 is attached to lid 49. Lid 49, which is interconnected by suitable spacer means (not shown) with device planes 48 and acts as a support member to insure proper alignment of shields 60 with each other, is comprised of a material (e.g., a non-conducting, non-magnetic material such as ceramic or plexiglass) including that used to form device planes 48. A uniform and planar magnetic field region 62 is, thereby, provided for each bubble device plane between pairs of adjacent parallel shields 60.

Since the magnetic field regions 62 are maintained planar and parallel relative to the shields 60, it is not necessary that the shields be aligned in a parallel plane with respect to either a field network 40 or conducting surfaces 52 and 54. This is especially advantageous to accomodate installation tolerances, and because it is desirable, in certain magnetic bubble domain applications, for the device chips 50 to be intentionally tilted at a predetermined angle with respect to a field network 40. By virtue of the electrically conducting shields 60, the vectorial summation of the magnetic field, as induced by the eddy currents therein, with the field induced by a field assembly 40 straightens the resultant field in regions 62 when there is misalignment, either by accident or by design, between the bubble device planes and either field network 40 or conducting surfaces 52 and 54.

By virtue of the instant configuration, the bubble device planes 48 and the associated bubble device chips 50 can be individually installed or removed from the field network 40 for inspection, repair or replacement. Present bubble domain devices encounter temperature sensitivity. Temperature rise can result from either self-generated heat or heat flow from adjacent heat-dissipating elements. With the bubble domain devices located in a region having a uniform external magnetic field, the temperature of the devices can be economically maintained to near ambient temperature, because access for air circulation or other cooling means is not constrained. Moreover, since eddy currents passing through a conductive surface simulate the existence of an additional coil wound core 42, the total inductance and corresponding heat that would otherwise be produced by the physical presence of an additional coil wound core (such as in a transformer relationship with core 42) is minimized. Additionally, the electrical connections which would be otherwise required to drive an additional coil wound core are eliminated. Hence, the space consumed and the cost of producing the instant open coil field network 40 (which is suitable for utilization in magnetic bubble memories) is minimized.

It will thus be apparent that while a preferred embodiment of the invention has been shown and described, various modifications and changes may be made without departing from the true spirit and scope of the invention.

What is claimed is:

1. An open coil field network comprising:
    at least first and second core means aligned in substantially adjacent planes with respect to one another;
    coil means having terminal means,
    said coil means wound respectively around each of said first and second core means;
    said terminal means adapted to receive a signal to energize said coil means and thereby induce a magnetic field between said adjacent first and second core means having a planar direction substantially coincident with that of said core means; and
    at least one magnetic bubble domain device disposed in the induced magnetic field between said adjacent first and second core means.

2. The open coil field network recited in claim 1, wherein said core means is comprised of a ferromagnetic material.

3. The open coil field network recited in claim 2, wherein said ferromagnetic material is a ferrite.

4. The open coil field network recited in claim 1, wherein said coil means includes respective first and second windings;
    said first winding wound around at least first and second faces of said first core means;
    said second winding wound around at least first and second faces of said second core means; and
    said at least one bubble domain device disposed outside of said first and second windings and between said adjacent first and second core means.

5. The open coil field network recited in claim 1, wherein said coil means includes first and second windings orthogonally wound with respect to one another around at least first and second faces of each of said first and second core means so as to cause said induced magnetic field between said adjacent core means to rotate relative to said at least one magnetic bubble domain device.

6. The open coil field network recited in claim 1, including bias structure means to enclose said first and second core means;
    said bias structure having top, bottom, and end walls;
    said end walls comprised of magnetic material magnetized in the same direction with respect to one another and adapted to generate a uniform, vertical magnetic field in a direction relatively perpendicular to the planar direction of said magnetic field induced between said first and second adjacent cores.

7. The open coil field network recited in claim 1, wherein said at least one magnetic bubble domain device is disposed on a non-conducting and non-magnetic substrate positioned between said first and second core means in a direction substantially coincident to that of said first and second core means.

8. The open coil field network recited in claim 1, wherein said at least one first and second core means are disposed on respective non-conducting and non-magnetic substrates, said substrates aligned in parallel planes with respect to one another.

9. In combination:
    at least one core means;
    first and second coil means having terminal means;
    said first and second coil means orthogonally wound with respect to one another around said at least one core means;
    first and second non-magnetic shield means aligned in substantially parallel planes with respect to one another;
    said terminal means adapted to receive a signal to energize said coil means and thereby induce a uniform magnetic field between said core means and said first and second shield means; and
    at least one magnetic bubble domain device disposed outside the windings of said first and second coil means and between said core means and at least one of said first and second shield means in the region of said induced magnetic field.

10. The combination recited in claim 9, wherein at least one magnetic bubble domain device is arranged between said core means and said first shield means and at least one bubble domain device is arranged between said core means and said second shield means.

11. The combination recited in claim 9, wherein said first and second shield means are comprised of an electrically conducting material.

12. The combination recited in claim 9, further including:
at least third and fourth non-magnetic shield means aligned in substantially parallel planes with respect to one another and connected to said first and second shield means to form an enclosure therewith,
said third and fourth shield means comprised of an electrically conducting material.

13. The combination recited in claim 12, wherein each of said first, second, third and fourth shield means is comprised of copper.

14. The combination recited in claim 9, wherein said core means is disposed immediately adjacent said first shield means, and
said magnetic bubble domain device is disposed immediately adjacent said second shield means.

15. The combination recited in claim 9, including a plurality of bubble domain device planes disposed in substantially parallel alignment with each other between said core means and at least one of said first and second shield means, and
non-magnetic plate means positioned adjacent each side of and aligned in a substantially parallel plane with said bubble domain device planes to thereby provide a uniform and planar magnetic field therebetween for each bubble domain device.

16. The combination recited in claim 15, wherein said plates are comprised of an electrically conducting material.

* * * * *